United States Patent
Brownell et al.

[11] Patent Number: 5,903,436
[45] Date of Patent: May 11, 1999

[54] EMULATIVE LID/HEATSPREADER FOR PROCESSOR DIE ATTACHED TO AN ORGANIC SUBSTRATE

[75] Inventors: Michael P. Brownell, Los Gatos; Nagesh K. Vodrahalli, Cupertino; James G. Maveery, San Jose; Richard M. Ramirez, Freemont, all of Calif.

[73] Assignee: Intel Corporation, Santa Clara, Calif.

[21] Appl. No.: 09/001,247

[22] Filed: Dec. 30, 1997

[51] Int. Cl.$^6$ ............................................. H05K 7/20
[52] U.S. Cl. ..................... 361/704; 361/707; 361/708; 361/713; 361/717; 361/718; 257/706; 257/717; 165/80.2; 165/80.3
[58] Field of Search ..................... 361/704, 714, 361/717–719; 257/706, 717–719, 720, 796; 174/16.3; 165/80.2, 80.3, 104.33

[56] References Cited

U.S. PATENT DOCUMENTS 4,914,812  4/1990  Webster .......................... 361/714
5,552,635  9/1996  Kim et al. ....................... 257/706

*Primary Examiner*—Leo P. Picard
*Assistant Examiner*—Boris L. Chervinsky
*Attorney, Agent, or Firm*—Arnold, White & Durkee

[57] ABSTRACT

A method and apparatus for making the weight load distribution more uniform over the surface of a processor die and improving the heat transfer between the processor die and a thermal spreader cap is provided. The apparatus includes generally a square-like box shaped thermal spreader cap having a cavity that conforms to the shape of the processor die. The thermal spreader cap fits over the processor die and has a cavity that is dome-like in shape. Additionally, the thermal spreader cap is attached to a thermal dissipative device which may in turn be connected to a heat sink. The apparatus provides a thinner and more uniform thermal interface layer between the processor die and the thermal spreader cap, thereby evening the weight load on the surface of the processor die and improving the heat flux between the processor die and the thermal spreader cap.

20 Claims, 3 Drawing Sheets

EMULATIVE LID/HEATSPREADER FOR PROCESSOR DIE ATTACHED TO AN ORGANIC SUBSTRATE

BACKGROUND OF THE INVENTION

1. FIELD OF THE INVENTION

This invention relates generally to a thermal interface between a semiconductor device and a thermal spreader cap, and, more particularly, to a thermal spreader cap that has a complementary shaped surface to that of the semiconductor device.

2. DESCRIPTION OF THE RELATED ART

Microprocessor devices typically include a semiconductor device or silicon die attached to a substrate. The substrate may be formed from a variety of materials including ceramic and printed circuit boards. These surfaces are generally known as substrates, and the printed circuit-like boards are commonly referred to as organic substrates. Because of the different coefficients of thermal expansion between the silicon die and the substrate it is attached to, the die typically bows away from the substrate, and takes on a convex shape when the die becomes heated, such as during operations. When viewed from the side, this die resembles the "crown" on a curved road.

To assist in dissipating heat generated within the die, a thermal spreader cap is placed on top of or around the die. The thermal spreader cap may be in direct contact with the die, or the thermal spreader cap and the die may have a layer between them, which is referred to as a thermal interface layer. This thermal interface layer in turn may contain a thermal interface material, which is in contact with the die and the side of the thermal spreader cap facing the die. Typically, the thermal interface layer is a highly conductive material that dissipates heat away from the die to the thermal spreader cap.

Under the current approach, the side of the thermal spreader cap that is in direct contact with the die, or the thermal interface material, has a cavity that fits over the processor die, but does not conform to the shape of the processor die. Typically, the cavity is rectangular in shape and forms a box over the bowed die.

Because the typical thermal spreader cap has a box shaped cavity, each point on the surface of the bowed die varies in distance from the thermal spreader cap. Consequently, if there is a thermal interface layer, the thickness of the thermal interface material between the die and the thermal spreader cap varies across the surface of the die. That is, there is more thermal interface material between the thermal spreader cap and the die where the die is closer to the substrate, e.g., at the edges of the die attached to the substrate. Correspondingly, there is less thermal interface material over the portion of the die bowed farthest away from the substrate, e.g., at the center of the processor die.

As a result of the uneven thickness and volume of the thermal interface material, the heat from the die does not dissipate away from the die in a substantially uniform manner. There is an uneven heat flux to the thermal spreader cap from the die that negatively impacts the cooling of the die. Additionally, if the thermal interface material is a liquid, e.g., grease, oftentimes the thermal interface liquid pumps away from the portion of the die surface that is generating the greatest amount of heat. The hottest portion of the die is usually the "crown" of the bowed die, because the heat seeks to dissipate to the thermal spreader cap from the point on the die where there is the least thermal interface material between it and the thermal spreader cap. Therefore, the pumping away of the thermal interface material from this point reduces the heat dissipated from the die. In addition to creating heat dissipation problems, this uneven thickness and volume of thermal interface material also results in an uneven weight load distribution on the die.

The present invention is directed to overcoming, or at least reducing, the effects of one or more of the problems set forth above.

SUMMARY OF THE INVENTION

In one embodiment of the present invention, a thermal spreader cap is provided. The thermal spreader cap is adapted to be positioned adjacent and dissipate heat from a semiconductor die. The die has a first surface that is adapted to be positioned adjacent to the die, and has a cross-sectional configuration of a preselected curvature. The thermal spreader cap also has a second surface that is adapted to be coupled to a thermal dissipative device.

In another embodiment of the present invention, a method for providing an improved heat flux from a semiconductor die to a thermal spreader cap is provided. The method includes forming a cavity in the thermal spreader cap. The cross-sectional configuration of the cavity substantially corresponds to the cross-sectional configuration of the die. The method also includes positioning the cavity of the thermal spreader cap adjacent the semiconductor die.

BRIEF DESCRIPTION OF THE DRAWINGS

Other objects and advantages of the invention will become apparent upon reading the following detailed description and upon reference to the drawings in which.

Figure 1:
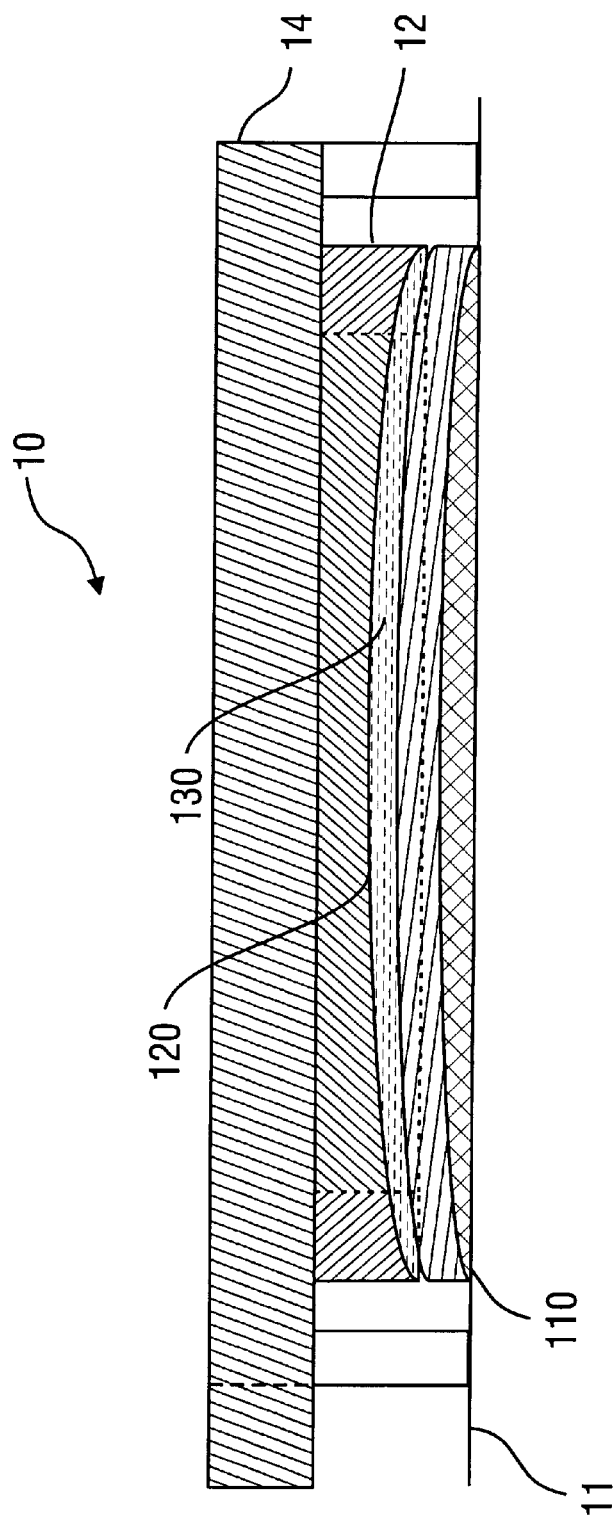
FIG. 1 is a cross-sectional view of a microprocessor assembly, including the emodiment of a thermal spreader cap assembly shown in FIG. 2.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but would nevertheless be a routine undertaking for those of ordinary skill in the art having the benefit of this disclosure.

Turning now to the drawings and referring initially to FIG. 1, an embodiment 10 of a microprocessor assembly in accordance with the invention is shown mounted on a substrate 11. The assembly 10 includes an embodiment 12 of a thermal spreader cap in accordance with the present invention that evenly distributes the weight load on a semiconductor die 110, e.g., a "flip-chip" processor, and improves the heat flux from the processor die 110 to a thermal dissipative device 14, e.g., a headplate.

Figure 2:
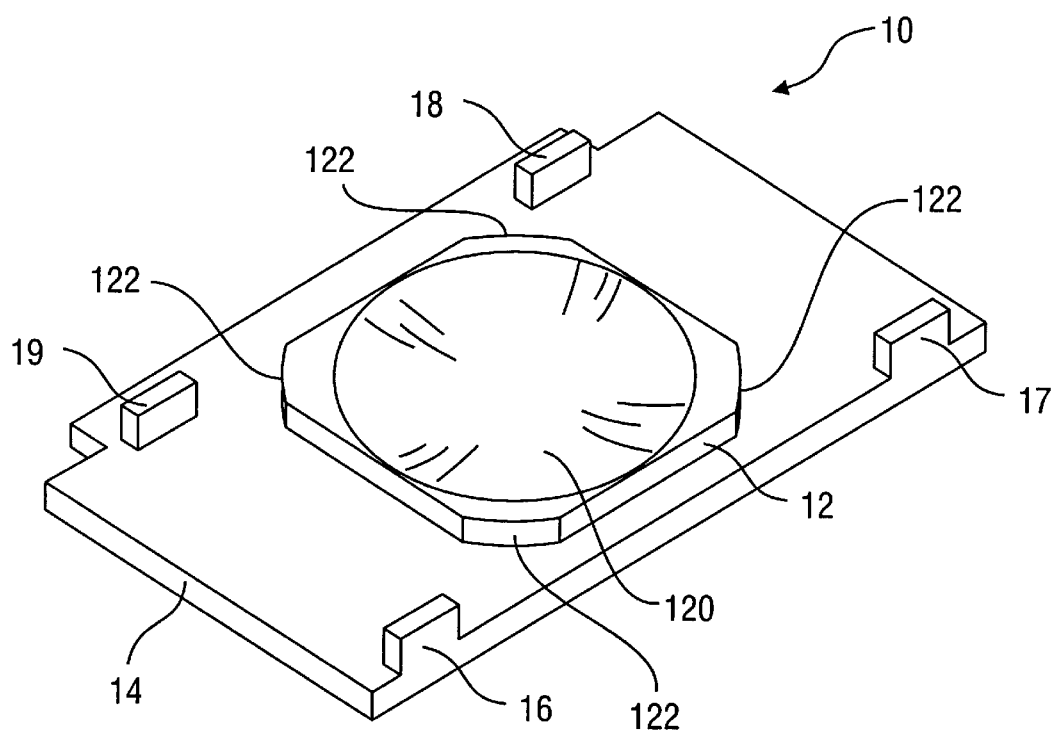
FIG. 2 is a perspective view of an embodiment of a thermal spreader cap assembly according to the present invention.

As shown in FIG. 2, the thermal spreader cap 12 is coupled to the thermal dissipative device 14. The coupling may be accomplished by any of a variety of means, including conventional means, such as gluing, welding, screwing, integral formation, or the like. The thermal dissipative device 14 is attached to the thermal spreader cap 12 to cool the die 110 more efficiently. Specifically, by drawing the heat transferred to the thermal spreader cap 12 from the processor die 110, the thermal dissipative device 14 dissipates the heat along its entire surface. The thermal dissipative device 14 may also be attached to a heat sink (not shown) to further enhance heat dissipation.

Referring to FIGS. 1 and 2, the thermal dissipative device 14 also includes four legs 16, 17, 18, 19 attached thereto and in direct physical contact with the substrate 11. These legs 16–19 provide support for the assembly 10 when it is disposed over the processor die 110, as illustrated in FIG. 1. The length of the legs 16–19 is selected to position the thermal spreader cap 12 adjacent the processor die 110, and may be selected to leave a small space between the processor die 110 and the thermal spreader cap 12. When the processor die 110 is operating, and therefore heated and bowed, the spacing, if any, is substantially uniform across the surface of the die 110. Additionally, the legs 16–19 also serve to mount the thermal spreader cap 12 and thermally dissipative device 14 to the substrate 11 via any of a variety of possible methods, such as gluing, welding, screwing, soldering, and the like.

Figure 3:
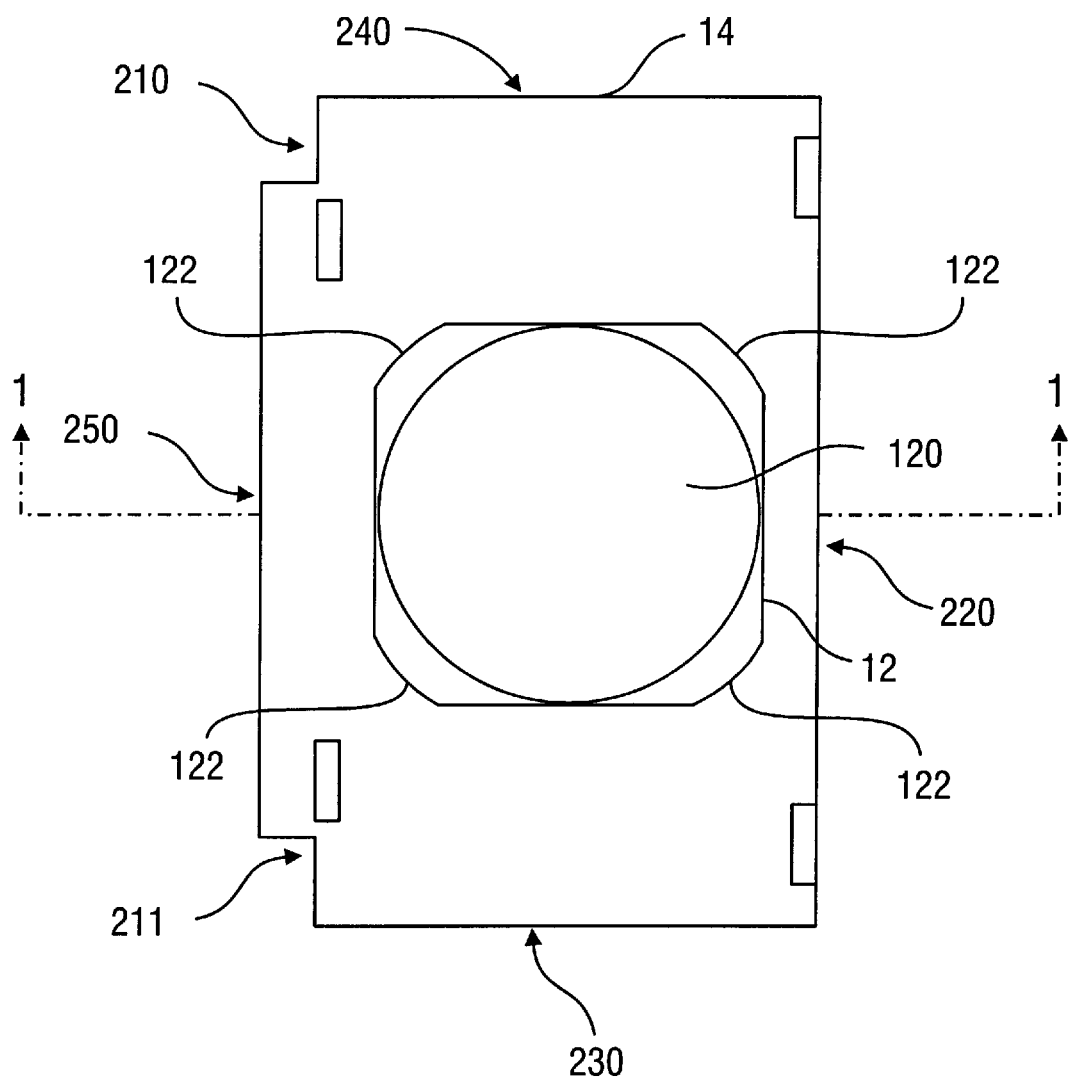
FIG. 3 is a top view of the embodiment of a thermal spreader cap assembly shown in FIG. 2.

Further, FIG. 3 shows that the thermal spreader cap assembly 10 includes two notches 210, 211 in the thermal dissipative device 14. These notches 210, 211 allow the assembly 10 to be placed in the appropriate packaging (not shown) without compromising the large surface area from which the heat is dissipated.

The embodiment of the thermal spreader cap 12 shown in FIG. 2 can be made by any variety of manufacturing methods, such as forging, die casting, or other similar high volume, low cost manufacturing techniques. As those of ordinary skill in the art will recognize, the thermal spreader cap 12 may be made of a number of thermally conductive materials, such as aluminum, copper, or the like.

In one embodiment, the thermal spreader cap 12 is approximately 24.900 mm. wide by 24.900 mm. (FIG. 3), but these dimensions may vary depending on the dimensions of the processor die 110 (FIG. 1). Additionally, the thickness of the thermal spreader cap 12 may also vary, depending upon the dimensions of the processor die 110 over which the thermal spreader cap 12 is disposed.

The thermal spreader cap 12, as viewed in FIGS. 2 and 3, also has rounded corners 122 with a radius curvature of 14.899 mm. This curvature allows the thermal spreader cap 12 to be placed over the processor die 110 safely by maintaining a distance between the otherwise sharp corners of the thermal spreader cap 12 and the processor die 110.

In this embodiment, and as seen in FIG. 2, the thermal spreader cap 12 forms a rounded dome-like cavity 120 on a side of the thermal spreader cap 12 adjacent the processor die 110. In one embodiment, the cavity 120 has a radial curvature of 1387.46 mm., which is designed to be substantially similar to the radius of curvature of the die 110 during operation. Again, this radial dimension may vary depending on the dimensions of the processor die 110. Furthermore, the cavity 120 may be formed by machining the thermal spreader cap 12 or by creating a die cast, forging, or the like to produce the thermal spreader cap 12 having an appropriately sized and shaped cavity 120.

The domed cavity 120 in the thermal spreader cap 12 has a similar configuration to that of the processor die 110 when operating. As shown in FIG. 1, a thermal interface layer 130 positioned between the die 110 and thermal spreader cap 12 has a substantially uniform thickness over the surface of the processor die 110. This uniformity results in a uniform weight load distribution over the surface of the processor die 110. Additionally, the curved cavity 120 in the thermal spreader cap 12 results in a thinner thermal interface layer 130 between the processor die 110 and the thermal spreader cap 12. This uniform and thinner thermal interface layer 130 results in an improved spreading of the heat from the processor die 110 to the thermal spreader cap 12, and eventually to the thermal dissipative device 14. It should be appreciated that the curvatures of the die 110 and the cavity 120 need not be identical to derive the benefits of the instant inventions. Rather, even a slight curvature in the cavity 120 or a rough approximation of the curvature of the die 110 allows the interface layer to be reduced, producing to some degree the benefits of the invention.

As illustrated in FIG. 3, the thermal dissipative device 14 that the thermal spreader cap 12 is attached to may be rectangular in shape with dimensions of 33.240 mm. wide, by 55.080 mm. long, by 2.030 mm. thick. The thermal spreader cap 12 is attached such that the center of the thermal spreader cap 12 is 14.876 mm from the length side edge 220 of the thermal dissipative device 14 without the two notches 210. Further, the thermal spreader cap 12 is attached to the thermal dissipative device 14 such that the center of the thermal spreader cap 12 is 27.540 mm. from both of the width side edges 230, 240 of the thermal dissipative device 14.

The notches 210, 211 in the thermal dissipative device 14, as viewed in the embodiment of FIG. 3, are 3.36 mm. wide by 5.770 mm. long. The legs 16–19 attached to the thermal dissipative device 14 are uniform in height, 2.470 mm; width, 1.520 mm.; and length, 5.330 mm. Two of the legs 16, 17 are attached on the length side edge 220 of the thermal dissipative device 14. These two legs 16, 17 are attached 2.640 mm. from the respective width side edges 230, 240 and are flush with the length side edge 220. The other two legs 18, 19 are attached 6.780 mm. from their respective width side edges 230, 240 and are 3.372 mm. from the notched length side edge 250. The die 110 is 21.600 mm. wide, by 21.600 mm. long, by 0.711 mm. thick, resulting in a bowed height of about 32 microns during heated operation of the die 110. Thus, during heated operation of the die 110, it assumes a curved orientation approximating the 1387.460 mm. radius curvature of the cavity 120. Additionally, if a thermal interface layer 130 is interposed between the cap 12 and the die 110, and material is placed in the thermal interface layer 130, the thickness of the layer 130 may range from approximately 0.012 mm. to 0.100 mm. If no material is placed in the thermal interface layer 130, however, the thickness of the thermal interface layer 130 may be about 0 mm.

Though the thermal interface layer 130 may be excluded in certain applications, when utilized, it may be composed of any of a variety of thermally conductive materials, including a thermal conductive grease, such as Shinetsu®, a thermal conductive film, such as Chomerics®, or the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A thermal spreader cap comprising:
    a first surface adapted to be positioned adjacent a semiconductor die, and a second surface adapted to be coupled to a thermal dissipative device, said first surface having a cross-sectional configuration of a preselected arcuate curvature, wherein the first surface of said thermal spreader cap is substantially uniformly spaced from said semiconductor die during operation resulting in heating and bowing of said semiconductor die.

2. The thermal spreader cap according to claim 1, wherein the preselected arcuate curvature of the first surface approximates the shape of the semiconductor die during operation and heating and bowing of said semiconductor die.

3. The thermal spreader cap according to claim 1, wherein the first surface is dome-like shaped.

4. The thermal spreader cap according to claim 1, wherein the preselected arcuate curvature of the first surface has a center substantially aligned with the geometric center of the thermal spreader cap.

5. The thermal spreader cap according to claim 1, wherein the thermal spreader cap is formed of a thermally conductive material.

6. The thermal spreader cap according to claim 1, wherein the thermal spreader cap has substantially rounded corners.

7. A method for providing an improved heat flux from a semiconductor die to a thermal spreader cap, comprising:
    forming a cavity in the thermal spreader cap, an arcuate cross-sectional configuration of the cavity substantially corresponding to an arcuate cross-sectional configuration of the semiconductor die during operation resulting in heating and bowing of said semiconductor die; and
    positioning the cavity of the thermal spreader cap adjacent the semiconductor die so that the first surface of said thermal spreader cap is substantially uniformly spaced from said semiconductor die during said operation resulting in heating and bowing of said semiconductor die.

8. The method according to claim 7, further comprising interposing a layer of thermal interface material in the cavity between the thermal spreader cap and the semiconductor die.

9. The method according to claim 7, wherein forming the cavity includes forming a dome-like recess on a side of the thermal spreader cap adjacent the semiconductor die.

10. The method according to claim 7, including forming the thermal spreader cap from a thermally conductive material.

11. A microprocessor assembly, comprising:
    a substrate;
    a semiconductor die mounted on said substrate having a first preselected arcuate cross-sectional configuration during operation resulting in heating and bowing of said semiconductor die; and
    a thermal spreader cap having a first surface positioned adjacent said semiconductor die, said first surface having an arcuate cross-sectional configuration similar to the first preselected arcuate cross-sectional configuration, wherein the first surface of said thermal spreader cap is substantially uniformly spaced from said semiconductor die during said operation resulting in heating and bowing of said semiconductor die.

12. A microprocessor assembly, as set forth in claim 11, further including a layer of thermal interface material disposed between said semiconductor die and said thermal spreader cap.

13. A microprocessor assembly, as set forth in claim 11, wherein said first surface has a dome-like configuration.

14. A microprocessor assembly, as set forth in claim 13, including a thermal dissipative device coupled to a second surface of said thermal spreader cap.

15. A microprocessor assembly, as set forth in claim 11, wherein said thermal spreader cap includes at least one leg engaging said substrate and positioning said thermal spreader cap in spaced relation to said semiconductor die.

16. A microprocessor assembly, as set forth in claim 11, including a thermal dissipative device coupled to a second surface of said thermal spreader cap.

17. A microprocessor assembly, as set forth in claim 1, further including a layer of thermal interface material disposed between said semiconductor die and said thermal spreader cap.

18. A microprocessor assembly, as set forth in claim 3, further including a layer of thermal interface material disposed between said semiconductor die and said thermal spreader cap.

19. The method according to claim 8, wherein forming the cavity includes forming a dome-like recess on the side of the thermal spreader cap adjacent the semiconductor die.

20. A microprocessor assembly, as set forth in claim 12, including a thermal dissipative device coupled to a second surface of said thermal spreader cap.

* * * * *

UNITED STATES PATENT AND TRADEMARK OFFICE
CERTIFICATE OF CORRECTION

PATENT NO. : 5,903,436
DATED : May 11, 1999
INVENTOR(S) : Brownell et al.

It is certified that error appears in the above-identified patent and that said Letters Patent is hereby corrected as shown below:

Column 3,
Line 60, delete "comers" and insert -- corners --.
Line 63, delete "comers" and insert -- corners --.

Signed and Sealed this

Twenty-ninth Day of June, 2004

JON W. DUDAS
*Acting Director of the United States Patent and Trademark Office*